US010466273B1

(12) United States Patent
Hwang et al.

(10) Patent No.: US 10,466,273 B1
(45) Date of Patent: Nov. 5, 2019

(54) SOCKET DEVICE FOR TESTING IC

(71) Applicants: Dong Weon Hwang, Gyeonggi-do (KR); Logan Jae Hwang, Flower Mound, TX (US); Jae Baek Hwang, Seoul (KR)

(72) Inventors: Dong Weon Hwang, Gyeonggi-do (KR); Logan Jae Hwang, Flower Mound, TX (US); Jae Baek Hwang, Seoul (KR)

( * ) Notice: Subject to any disclaimer, the term of this patent is extended or adjusted under 35 U.S.C. 154(b) by 0 days.

(21) Appl. No.: 16/233,766

(22) Filed: Dec. 27, 2018

(30) Foreign Application Priority Data

Oct. 10, 2018 (KR) .................... 10-2018-0120292

(51) Int. Cl.
| H01R 12/00 | (2006.01) |
| G01R 1/04 | (2006.01) |
| H01R 12/71 | (2011.01) |
| H01R 13/627 | (2006.01) |
| G01R 31/28 | (2006.01) |
| H01R 13/193 | (2006.01) |
| H01R 13/24 | (2006.01) |

(52) U.S. Cl.
CPC ....... G01R 1/0466 (2013.01); G01R 31/2886 (2013.01); H01R 12/716 (2013.01); H01R 13/193 (2013.01); H01R 13/6272 (2013.01); H01R 13/24 (2013.01); H01R 2201/20 (2013.01)

(58) Field of Classification Search
CPC ......... H01R 12/88; H05K 7/1023; H05K 7/12
USPC .................................................. 331/331, 73
See application file for complete search history.

(56) References Cited

U.S. PATENT DOCUMENTS

| 5,447,448 A * | 9/1995 | Noriyuki | H05K 7/1023 439/331 |
| 5,609,497 A * | 3/1997 | Kawabe | H05K 7/1023 439/331 |
| 6,086,387 A * | 7/2000 | Gallagher | G01R 1/0483 439/331 |
| 7,030,638 B2 * | 4/2006 | Stutzman | G01R 1/0466 324/750.05 |
| 7,101,209 B2 * | 9/2006 | Yates | G01R 1/0466 324/756.02 |
| 7,824,188 B2 * | 11/2010 | Yokoyama | H05K 7/1061 439/331 |

(Continued)

FOREIGN PATENT DOCUMENTS

| KR | 1020100052721 A | 5/2010 |
| KR | 1020140134820 A | 11/2014 |

*Primary Examiner* — Neil Abrams
(74) *Attorney, Agent, or Firm* — Levenfeld Pearlstein, LLC

(57) ABSTRACT

Disclosed is a socket device for testing an IC, the socket device including: a base on which an integrated circuit (IC) is mounted; a contact module having multiple contacts; a floating hinge block elastically supported on a side of the base in a vertical direction; a lid configured to rotate with the floating hinge block and having a pressing portion on a bottom surface thereof; a floating latch elastically supported on a side of the base to be parallel to the floating hinge block such that the lid is fixed; a first camshaft installed by penetrating the base and the floating hinge block and adjusting a height of the floating hinge block; a second camshaft installed by penetrating the base and the floating latch and adjusting a height of the floating latch; a lever; a handle; and a link connected to the lever and the handle respectively to rotate independently.

8 Claims, 10 Drawing Sheets

(56) References Cited

U.S. PATENT DOCUMENTS 7,862,363 B2 *  1/2011  Chen ................... H05K 7/1007
                                                  324/756.02

* cited by examiner

SOCKET DEVICE FOR TESTING IC

CROSS REFERENCE TO RELATED APPLICATION

The present application claims priority to Korean Patent Application No. 10-2018-0120292, filed Oct. 10, 2018, the entire contents of which is incorporated herein for all purposes by this reference.

BACKGROUND OF THE INVENTION

Field of the Invention

The present invention relates to a clamshell type-socket device for testing an integrated circuit (IC).

Description of the Related Art

In general, a socket for an integrated circuit (IC) is provided in a test board or a burn-in board, and is used in a system for testing an IC in which a power supply for operating the IC, a burn-in chamber or a peripheral device allowing input and output an electrical signal, and an additional test device measuring characteristics of the IC are connected to each other through an input/output lead (I/O lead) formed on the board (test board or burn-in board).

Among widely used various types of ICs, a ball grid array (BGA) is a type in which an IC is greatly reduced in size and thickness by arranging IC leads, i.e., balls, on the entire bottom surface of the IC.

On the other hand, a land grid array (LGA) is a type that differs from the BGA type IC in that a ball is not attached to a pad or a land.

In recent years, LGA type ICs, and BGA and LGA composite type ICs have been variously produced. A socket for testing an LGA type IC or a composite type IC has multiple contacts having a predetermined elastic force in a vertical direction, and lower leads of the contacts are connected to printed circuit board (PCB) by contacting or soldering.

Here, upper leads of the contacts are configured to contact to IC leads loaded on a socket, and in order to achieve electrically safe contact, the socket is required to have a pressing device pressing down an IC.

It is possible to calculate a physical force applied to one contact by dividing an external force, which is applied by the pressing device on an upper surface of the IC, by the number of contacts.

More specifically, a physical force applied to one contact is roughly 10 gf. For example, when the number of leads of the IC is five hundreds, it is estimated that a physical force of about 5.0 kgf is required to be applied to the semiconductor device.

Accordingly, a socket for testing an IC is required to have a pressing means capable of effectively applying a powerful physical force as described above to the IC.

A socket having a pressing means capable of strongly pressing the IC is required because the number of leads of an IC is increased, a lead pitch is narrowed, and a thickness of the IC is likely to be further thinned in the future. Particularly, required is a socket having a pressing means capable of strongly pressing the IC and keeping an entire surface of the IC horizontally with respect to an upward contact force applied to the leads of the IC when performing a burn-in test at a high temperature for a long time.

FIGS. 1 and 2 are cross-sectional views each illustrating a socket device for testing an IC according to the related art. Specifically, FIG. 1 illustrates a state in which a lid is opened, and FIG. 2 illustrates a state in which the lid is closed.

Referring to FIG. 1, a clamshell type-socket device according to the related art includes: a base 20 on which an IC 10 is placed; multiple contacts 30 provided on the base 20 to electrically connect leads of the IC 10 and leads of a PCB (not illustrated) to each other; and a lid 40 hinged to a side of an upper end of the base 20 and having a latch 41 at the tip thereof, which is capable of being engaged with the base 20, to press the IC 10.

The base 20 is provided at the center thereof with a mounting portion 21 in which the IC 10 is mounted and positioned, and the mounting portion 21 is provided with the multiple contacts 30 electrically connects the leads of the IC 10 to the leads of the PCB. The base 20 is provided with an engaging part 22 to engage the latch 41 of the lid 40 therewith.

The lid 40 is assembled to be rotatable with respect to the base 20 by a hinge pin 42. The hinge pin 42 is provided with a hinge spring 43 elastically supporting the base 20 and the lid 40. The lid 40 is provided at the tip thereof with the latch 41, which is capable of being engaged with the engaging part 22 of the base 20. The latch 41 is elastically supported by a coil spring 44 such that the latch 41 and the engaging part 22 keep a closed state of the lid 40 by an elastic force of the coil spring 44.

The lid 40 is provided with a pressing portion 45 configured to protrude from an approximately central portion of a bottom surface thereof. When closing the lid 40, the pressing portion 45 presses an upper portion of the IC 10 such that the leads of the IC 10 and the contacts 30 are brought into contact with each other with a sufficient contact force, thereby reducing a contact resistance therebetween.

However, the clamshell type-socket device of the related art may scratch an upper surface of the IC 10 when loading the IC. In particular, in case that an upper surface of an IC is a bare die, the IC may be damaged.

Specifically, referring to FIG. 2, when mounting the IC 10 on the base 20 and closing the lid 40, the lid 40 covers the base 20 with respect to the hinge pin 42, which is a fixed rotation axis. In this process, the pressing portion 45 presses the IC 10 at a predetermined angle θ in a state where the edge of the pressing portion 45 is in line contact with the upper surface of the IC 10. Here, a strong compressive force acts on a predetermined portion (the line contact portion with the IC) of the upper surface of the IC 10 such that scratches or damage to the IC may occur.

In the clamshell type-socket device of the related art, the lid 40 has the rotation axis fixed with respect to the base 20 and the opening and closing operations are performed, and thus the IC may be damaged when loading the IC.

In particular, as mentioned above, the leads on the contacts are required to be pressed with a predetermined physical force for electrically stable contact with the leads of the IC. Therefore, as the number of leads of an IC increases, there is a high possibility that the IC in the clamshell type-socket device is damaged when loading the IC.

DOCUMENTS OF RELATED ART (Patent Document 1) Korean Patent Application Publication No. 10-2014-0134820, published on Nov. 25, 2014; and (Patent Document 2) Korean Patent Application Publication No. 10-2010-0052721, published on May 20, 2010)

SUMMARY OF THE INVENTION

Accordingly, the present invention has been made keeping in mind the above problems occurring in the related art, and the present invention is intended to propose a socket device for testing an integrated circuit (IC), in which a pressing force acts evenly on an entire upper surface of an IC when loading the IC on the clamshell type-socket device, thereby preventing damage to the IC.

In order to achieve the above object, there is provided a socket device for testing an IC, the device including: a base on which an IC is mounted; a contact module provided on the base and having multiple contacts electrically connecting leads of the IC and leads of a printed circuit board (PCB); a floating hinge block provided in a manner that being elastically supported on a side of the base in a vertical direction; a lid configured to rotate with the floating hinge block and having a pressing portion on a bottom surface thereof, which is configured to protrude to press an upper surface of the IC; a floating latch elastically supported on a side of the base to be parallel to the floating hinge block such that the lid is fixed; a first camshaft installed by penetrating the base and the floating hinge block and adjusting a height of the floating hinge block according to a rotation angle; a second camshaft installed by penetrating the base and the floating latch and adjusting a height of the floating latch according to a rotation angle; a lever assembled with the first camshaft as one body and rotating; a handle assembled with the second camshaft as one body and rotating; a link in which both ends thereof are connected to the lever and the handle respectively to rotate independently.

Each of the first camshaft and the second camshaft may include: a first section having a circular cross section and rotatably assembled with the base; and a second section extending from the first section, having a cam surface, which forms a plane in an axial direction on a part of an outer circumferential surface, and assembled with the floating hinge block and the floating latch individually.

Each of the floating hinge block and the floating latch may have an assembly hole through which the corresponding camshaft is inserted, wherein the assembly hole has a plane in which surface contact is made with the corresponding cam surface.

Multiple elastic members arranged in parallel may be further provided between the floating latch and the base, wherein the floating latch has a torque, which acts in a direction of engagement with the lid with respect to a rotation axis of the second camshaft. More preferably, the elastic members may have different spring constants.

The pressing portion may further include a heating unit controlling temperature.

The contact module may include: a fixed plate on which the multiple contact pins are disposed such that the fixed plate is fixed to the base; and a floating plate which is elastically supported on the fixed plate to be spaced apart each other and through which a top end portion of the contact pins protrudes. More preferably, the floating plate may be formed with a guiding surface 113a, which is an inclined side surface thereof to guide a mounting position of the IC.

According to the present invention, there is provided a socket device for testing an IC, the device including: a base; a clam shell type lid being opened and closed with respect to the base; a floating hinge block elastically supported with respect to the base in a vertical direction such that lid is rotatably assembled; a floating latch elastically supported with respect to the base to be parallel to the floating hinge block such that the lid is fixed; and camshafts interlocking with a rotational motion of a handle unit to adjust heights of the floating hinge block and the floating latch, whereby the IC can be pressed with a uniform pressing force when loaded, thereby preventing damage to the IC.

Further, in the socket device for testing an IC of the present invention, a heating unit controlling a temperature is further provided on a pressing portion of the lid pressing the IC, whereby the test can be performed at an appropriate temperature condition.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

All terms or words used in the specification and claims are not limited to a meaning that is commonly understood by people or is defined in dictionaries, and should be interpreted as having a meaning that is consistent with meaning in the context of the relevant art.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

Hereinbelow, preferred embodiments of the present invention will be described in detail with reference to the accompanying drawings.

Figure 1:
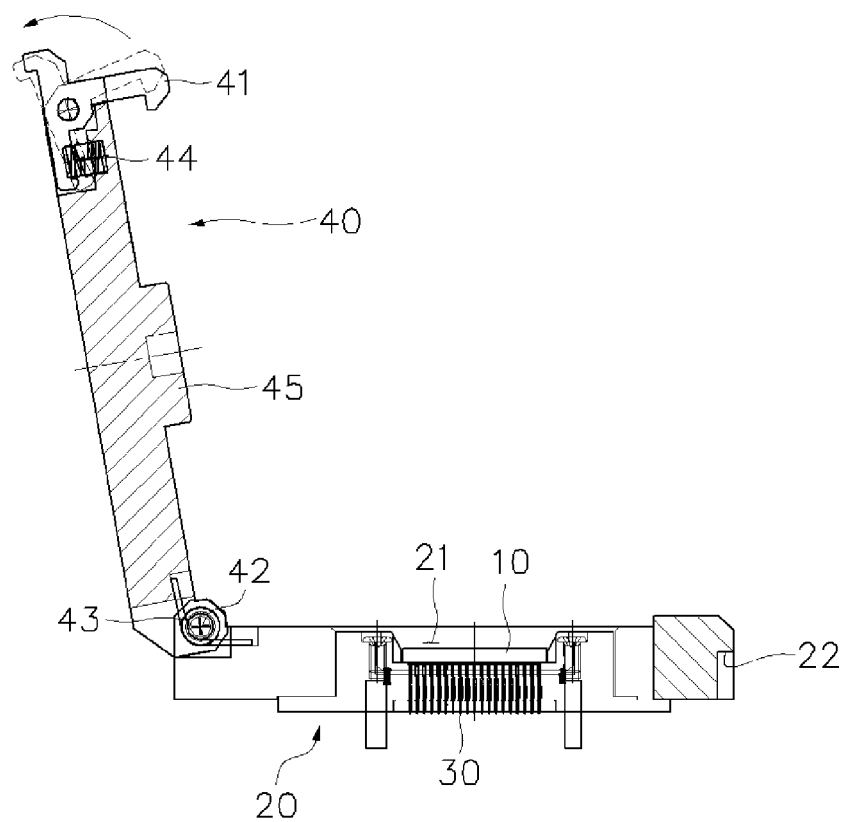
FIGS. 1 and 2 are cross-sectional views each illustrating a configuration of a socket device for testing an integrated circuit (IC) according to the related art.
Figure 2:
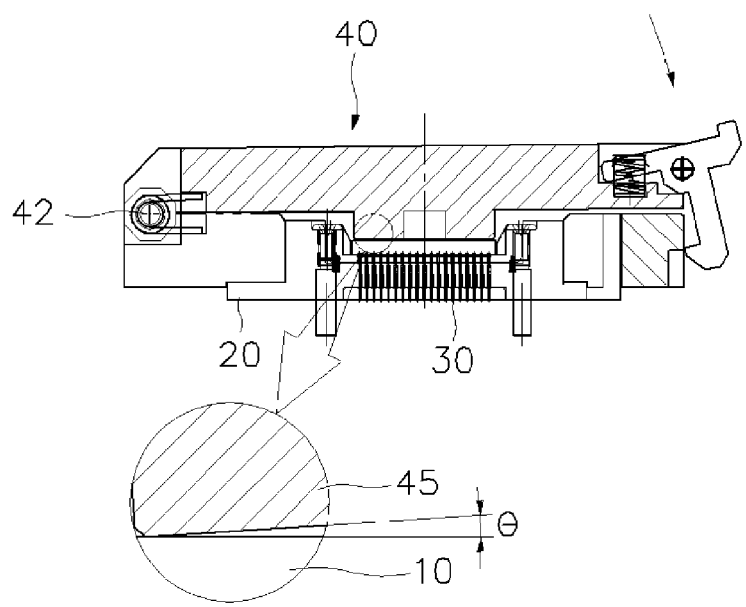
Figure 3:
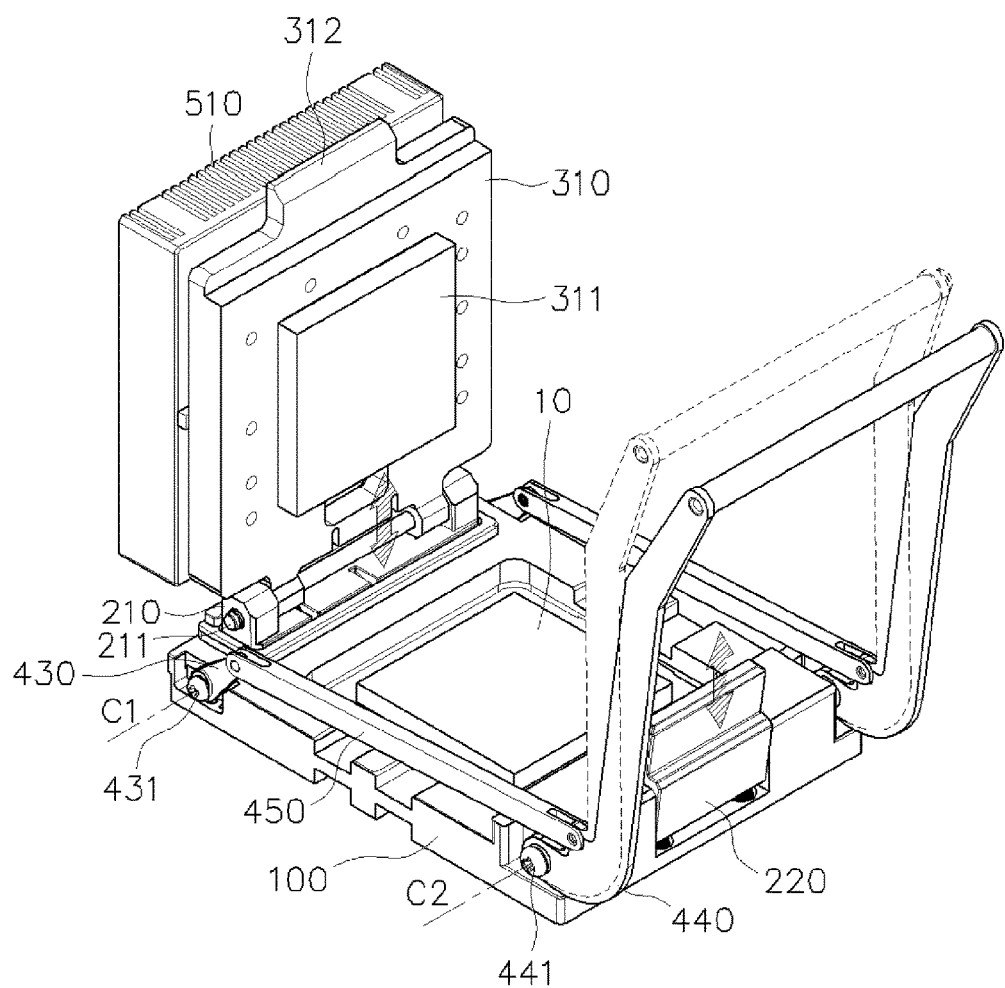
FIGS. 3 and 4 are perspective views each illustrating a socket device according to an embodiment of the present invention.
Figure 4:
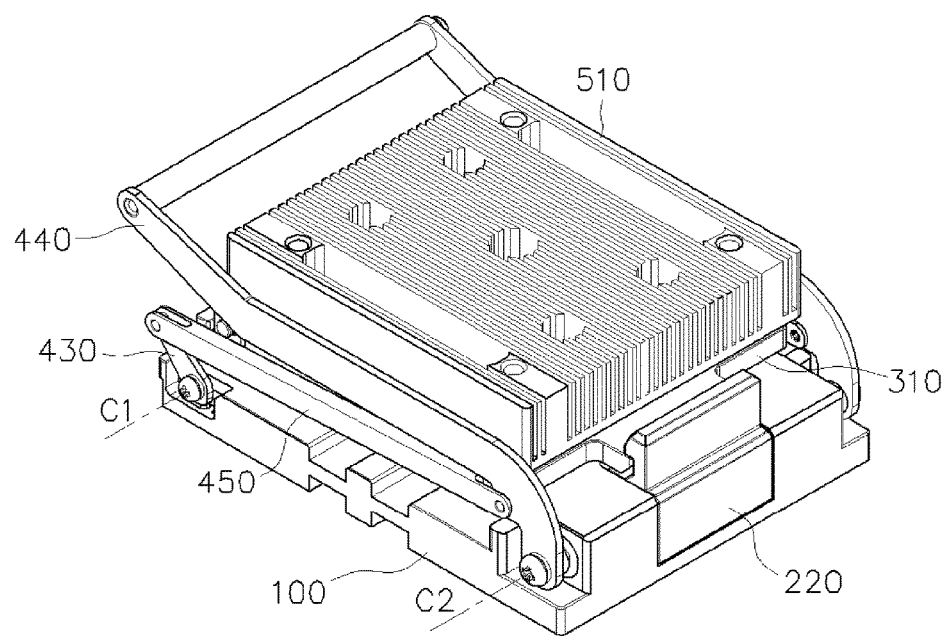

FIGS. 3 and 4 are perspective views each illustrating a socket device according to an embodiment of the present invention. Specifically, FIG. 3 illustrates a state in which a lid is opened, and FIG. 4 illustrates a state in which the lid is closed.

Referring to FIGS. 3 and 4, the socket device according to the present invention includes: a base 100 on which an integrated circuit (IC) 10 is mounted; a floating hinge block 210 provided in a manner that being elastically supported on an end of the base 100 in a vertical direction; a lid 310 configured to rotate with the floating hinge block 210 and having a pressing portion 311 on a bottom surface thereof, which is configured to protrude to press an upper surface of the IC 10; a floating latch 220 elastically supported on a side of the base 100 to be parallel to the floating hinge block 210 such that the lid 310 is fixed; a lever 430 assembled with the first camshaft as one body in which a shaft C1 penetrating the base 100 and the floating hinge block 210 is installed and rotating; a handle 440 assembled with the second camshaft as one body in which a shaft C2 penetrating the base 100 and the floating latch 220 is installed and rotating; and a link 450 in which both ends thereof are connected to the lever 430 and the handle 440 respectively to rotate independently.

Each of the lever 430, the handle 440, and the link 450 may be symmetrically in a pair disposed on left and right sides of the base 100 to constitute a handle unit. By operating the handle unit, the IC is loaded and unloaded. Hereinafter, a detailed operation thereof will be described in detail.

The base 100 has an approximately square structure and is provided at the center thereof with a mounting portion on which the IC 10 is mounted. The floating hinge block 210 and the floating latch 220 are provided at both ends of the mounting portion. The floating hinge block 210 is rotatably assembled with the lid 310 by a hinge pin 211. Although not illustrated, the base 100 may have multiple mounting holes to assemble with a printed circuit board (PCB).

Each of the floating hinge block 210 and the floating latch 220 provided at an upper portion of the base 100 is elastically supported by an elastic body in the vertical direction. In addition, each of the floating hinge block 210 and the floating latch 220 interlocks with a rotational motion of the camshaft integrally fixed to the lever 430 and the handle 440 respectively such that a height is adjusted. Hereinafter, a detailed description will be described in detail with reference to the related drawings. Reference numerals 431 and 441 denote shaft bolts with which the lever 430 and the handle 440 are screwed such that the lever 430 and the handle 440 are assembled with the respective camshafts.

The lid 310 has a hook protrusion 312 configured to protrude from the tip end thereof and fitted with the floating latch 220, and has the pressing portion 311 on an approximate center of the bottom surface thereof, the pressing portion 311 being configured to protrude to press the upper surface of the IC 10. A heat sink 510 may be further provided on a top surface of the lid 310 for heat dissipation.

The socket device having the structure described above is configured such that the IC 10 is disposed on the base 100 with the lid 310 opened, and then the lid 310 is closed so that the hook protrusion 312 and the floating latch 220 are engaged with each other. Here, the pressing portion 311 is horizontally positioned while spaced apart from the IC 10. Thereafter, as illustrated in FIG. 4, when pushing and rotating the handle 440, the lid 310 moves downward in a manner being kept even such that the pressing portion 311 is in surface contact with the upper surface of the IC 10 to press the IC 10 at a predetermined pressure.

Figure 5:
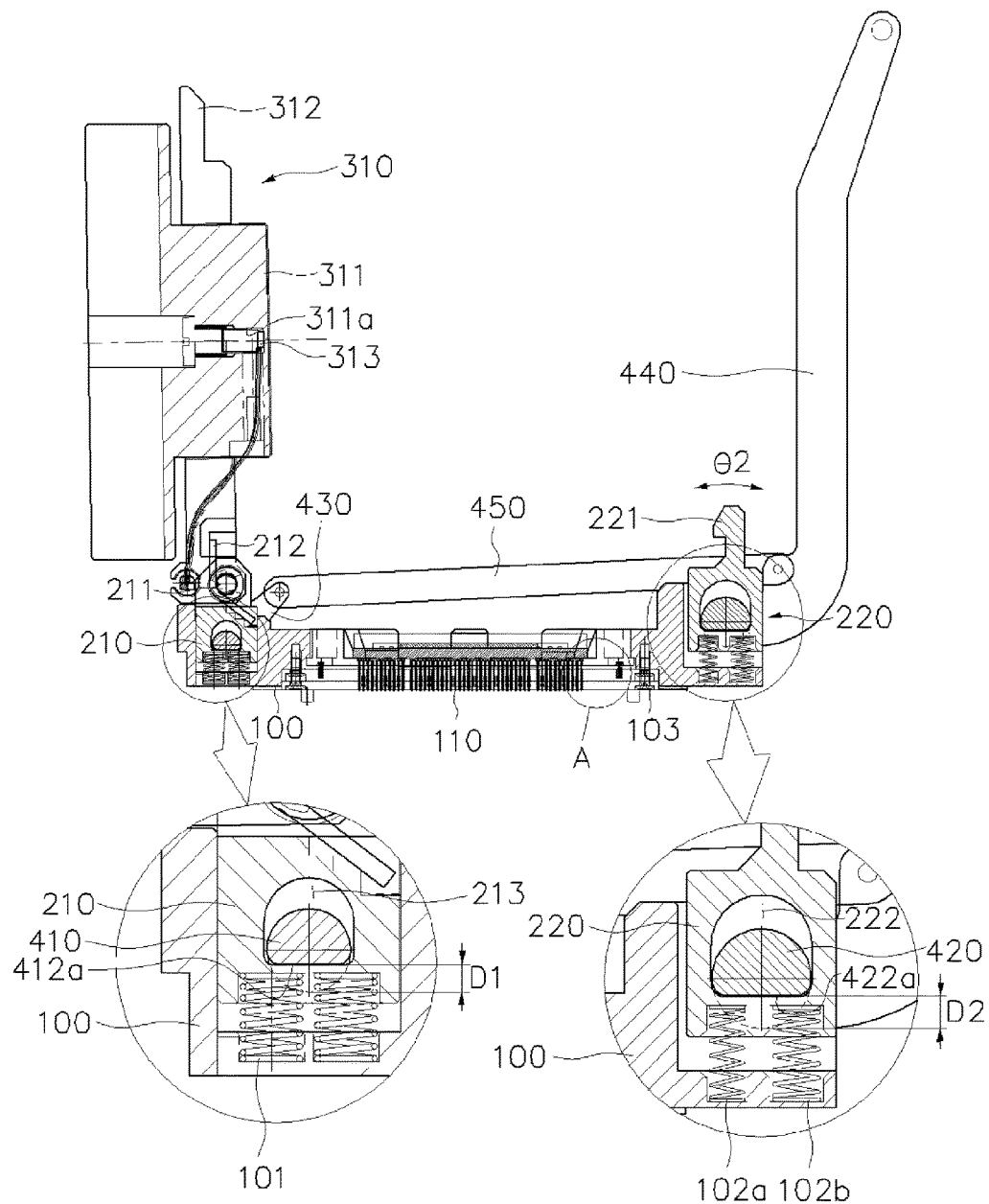
FIGS. 5 and 6 are cross-sectional views each illustrating a configuration of the socket device according to the embodiment of the present invention.
Figure 6:
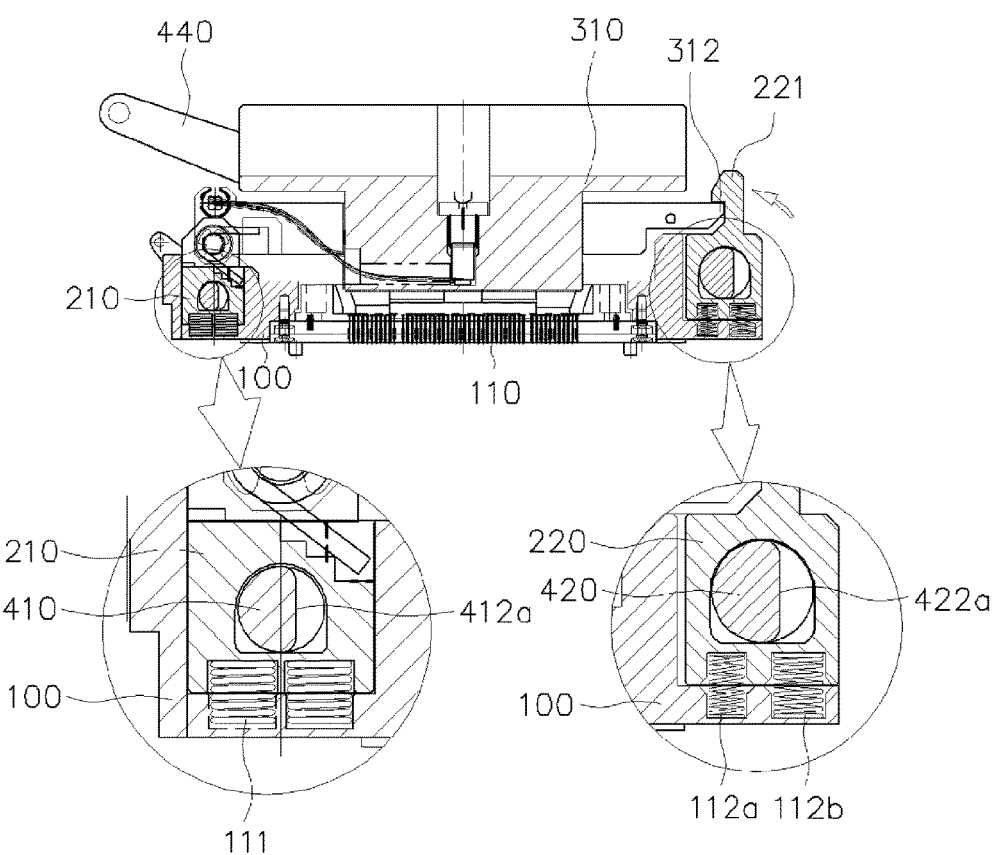

FIGS. 5 and 6 are cross-sectional views each illustrating a configuration of the socket device according to the embodiment of the present invention. Specifically, FIG. 5 illustrates a state in which the lid is opened, and FIG. 6 illustrates a state in which the lid is closed.

Referring to FIGS. 5 and 6, the floating hinge block 210 and the floating latch 220 are elastically supported by elastic members 101, and 102a and 102b respectively at both ends of the base 100 with respect to the mounting portion on which the IC 10 is mounted so as to be vertically movable within predetermined heights D1 and D2.

Specifically, the floating hinge block 210 is provided on the base 100 to be vertically movable, and provided with a first camshaft 410 penetrating the base 100 and the floating hinge block 210 horizontally. The first camshaft 410 has a circular cross-section, and partly has a cam surface 412a, which forms a plane in an axial direction on a part of an outer circumferential surface. In addition, the floating hinge block 210 is provided with a first assembly hole 213 in which the first camshaft 410 is installed. An upper portion of the first assembly hole 213 has a curvature approximately same with that of the first camshaft 410 while a lower portion thereof has a plane in which a surface contact is made with the cam surface 412a.

Therefore, the floating hinge block 210, which is elastically supported by the first elastic member 101, is moved vertically within the range of the predetermined height D1 according to a rotation angle of the first camshaft 410.

The floating latch 220 is provided with a latch protrusion 221, which engages with the hook protrusion 312, at an upper end thereof, and provided with a second camshaft 420 passing through the base 100 and the floating latch 220. The second camshaft 420 has a circular cross-section, and partly has a cam surface 422a, which forms a plane in an axial direction on a part of an outer circumferential surface. In addition, the floating latch 220 is provided with a second assembly hole 222 in which the second camshaft 420 is installed in a penetrating manner. An upper portion of the second assembly hole 222 has a curvature approximately same with that of the second camshaft 420 while a lower portion thereof has a plane in which a surface contact is made with the cam surface 422a. In the same manner as the floating hinge block 210, the floating latch 220, which is elastically supported by the second elastic members 102a and 102b, is moved vertically within the range of the predetermined height D2 according to a rotation angle of the second camshaft 420.

Meanwhile, the floating latch 220 may be allowed to rotate in forward and backward directions θ2 within a predetermined angle range with the second camshaft 420 as a rotation axis so as to engage with the hook protrusion 312. The second elastic members 102a and 102b elastically supporting the floating latch 220 may be multiple members. Preferably, the second elastic members 102a and 102b are a first coil spring 102a and a second coil spring 102b, which are disposed in parallel below the floating latch 220 to apply a predetermined torque to the floating latch 220 with respect to the rotation axis of the second camshaft 420. Here, the second coil spring 102b has a larger spring constant than the first coil spring 102a. Therefore, the second elastic members 102a and 102b elastically support the latching protrusion 221 in a direction of engagement with the hook protrusion 312 and support the floating latch 220 in the upward direction.

At the upper end of the floating hinge block 210, the lid 310 is rotatably assembled with the lid 310 by a hinge pin 211. A hinge spring 212 may be inserted into the hinge pin 211 to elastically support the lid 310 in opening and closing directions such that the base 100 and the lid 310 are elastically supported.

A hollow 311a may be formed inside the pressing portion 311, and a heating unit 313 may be provided in the hollow 311a. The heating unit 313 may be a heating wire that generates heat by an external current, but is not limited thereto. In addition, a resistance thermometer that measures temperature may be provided to the heating unit 313 such that the IC 10 can be tested by heating at an appropriate temperature.

A contact module 110 has multiple contacts and is fixed to the base 100. In this embodiment, the contact module 110 is fixed to the base 100 by an assembly bolt 103.

Figure 7:
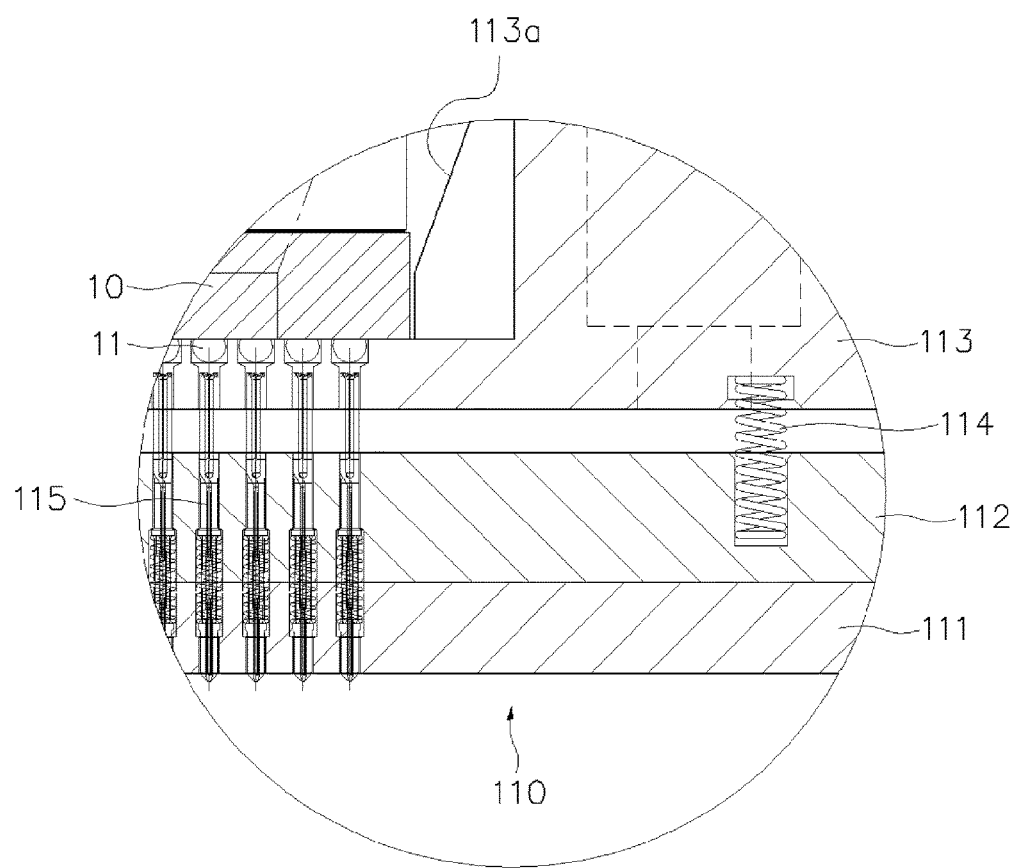
FIG. 7 is an enlarged view of a portion A in FIG. 5.

FIG. 7 is an enlarged view of a portion A in FIG. 5.

Referring to FIG. 7, the contact module 110 may include: fixed plates 111 and 112 on which multiple contact pins 115 are disposed such that the fixed plates 111 and 112 are fixed to the base; and a floating plate 113 which is elastically supported on the fixed plates 111 and 112 to be spaced apart each other and through which a top end portion of the contact pins 115 protrudes.

The fixing plates 111 and 112 may be a lower plate 111 and an upper plate 112, and may be fixed to the base by an additional assembly bolt.

The multiple contact pins 115 penetrate through the fixing plates 111 and 112. Here, the contact pins 115 may be a known spring type probe such as a pogo pin, or a stamp pin, or a pin of pressure sensitive conductive rubber (PCR) type.

The floating plate 113 on which the IC 10 is mounted is elastically supported by multiple springs 114 such that the floating plate 113 is spaced apart from an upper portion of the fixing plates 111 and 112. The floating plate 113 is formed with through holes corresponding to the contact pins 115, which are fixed to the fixing plates 111 and 112. Each top end portion of the contact pins 115 passes the through holes to protrude and contacts with each lead 11 of the IC 10.

The floating plate 113 may be formed with a guiding surface 113a, which is an inclined side surface thereof to guide a mounting position of the IC 10.

Each height adjustment of the floating hinge block 210 and the floating latch 220 described above is performed by operation of the handle unit that is driven in synchronization with the respective camshafts 410 and 420.

Figure 8A:
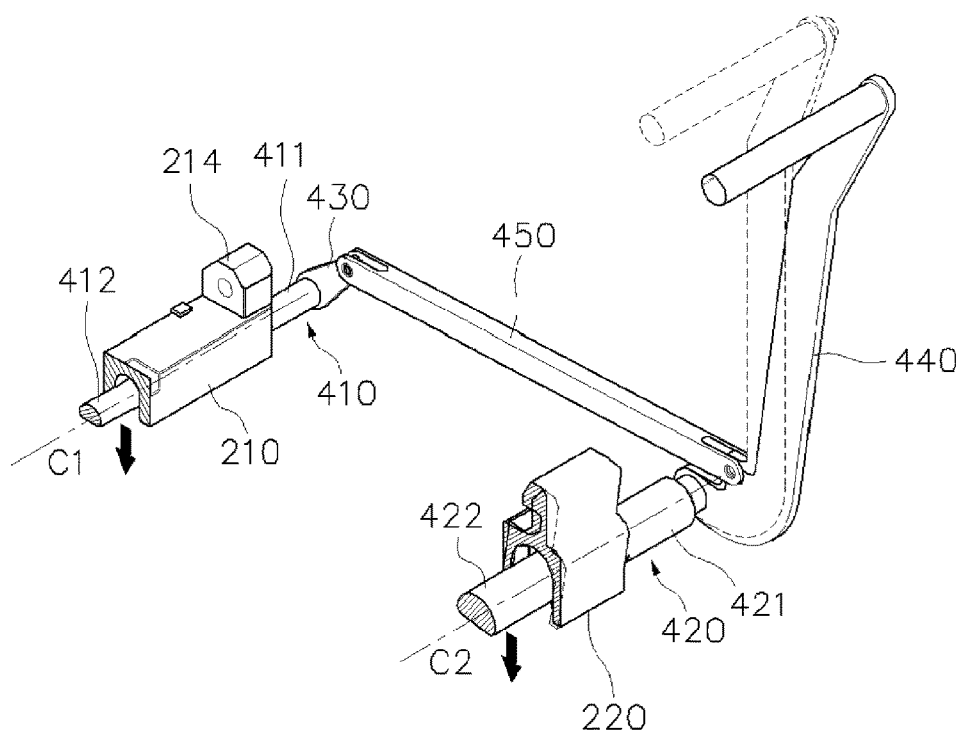
FIGS. 8A and 8B are views each illustrating an operating relation between a handle unit and a camshaft of the socket device according to the embodiment of the present invention.
Figure 8B:
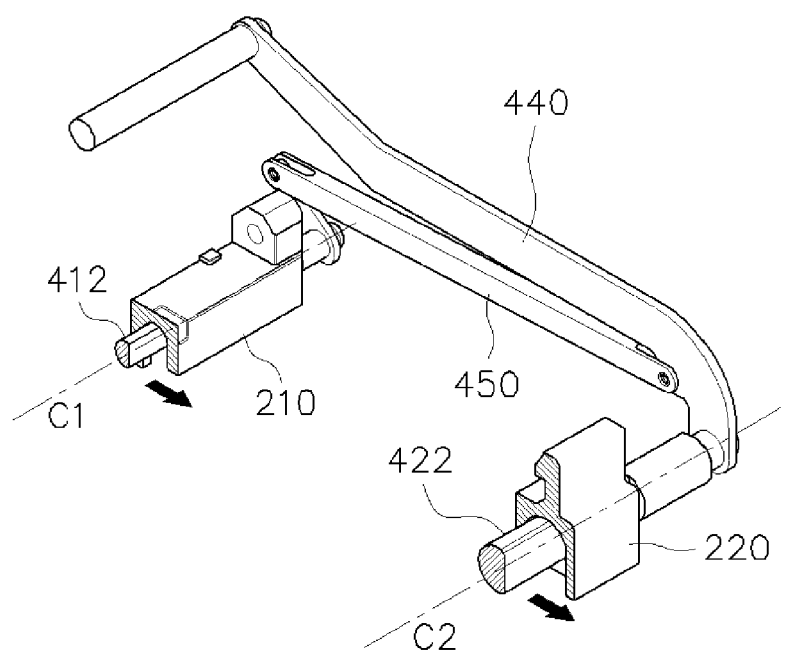

FIGS. 8A and 8B are views each illustrating an operating relation between a handle unit and a camshaft of the socket device according to the embodiment of the present invention, wherein arrows indicate cam surface direction of each camshaft.

FIG. 8A illustrates a positional relation between the handle unit and the camshaft with the lid opened. The first camshaft 410 includes a first section 411 having a circular cross section and a second section 412 having a cam surface. The first section 411 of the first camshaft 410 having the circular cross section is installed in the base (not shown) and axially rotated. The second section 412 having the cam surface is assembled with the floating hinge block 210. Reference numeral 214 denotes a hinge bracket assembled with the lid by the hinge pin.

In the same manner as the first camshaft 410, the second camshaft 420 includes a first section 421 having a circular cross section and a second section 422 having a cam surface. The first section 421 is installed in the base (not shown) and axially rotated and the second section 422 is assembled with the floating latch 220.

Meanwhile, the first camshaft 410 is assembled with the lever 430 as one body by the shaft bolt and rotates, and the second camshaft 420 is assembled with the handle 440 by the shaft bolt and rotates. The lever 430 and the handle 440 are connected by the link 450 such that the first camshaft 410 and the second camshaft 420 are synchronized with each other by operation of rotating the handle 440. In this embodiment, the cam surfaces of the first camshaft 410 and the second camshaft 420 have a positional relation oriented downward when the handle 440 is substantially at a right angle.

As shown in FIG. 8B, when pushing the handle 440 to be in a horizontal position, the cam surfaces of the first camshaft 410 and the second camshaft 420 are oriented toward the horizontal direction.

The cam surfaces of the camshafts 410 and 420 are rotated in a range of approximately 90 degrees by the operation position of the handle 440 (vertical/horizontal). As described above, the floating hinge block 210 and the floating latch 220 are elastically supported in the upward direction by the elastic members and may be adjusted in heights thereof according to rotational angles of the respective cam shafts 410 and 420.

A loading process of the IC by the socket device having the above-described configuration is as follows.

Referring to FIG. 5, the IC 10 is mounted on the base 100 with the lid 310 opened, and the lid 310 is closed to engage the hook protrusion 312 and the floating latch 220 with each other. Meanwhile, in the vertical state of the handle 440, the pressing portion 311 of the lid 310 is kept being spaced apart from the IC 10 by floating hinge block 201 and the floating latch 220, which are supported by the elastic members 101, 102a, and 102b.

Thereafter, as illustrated in FIG. 6, when rotating the handle 440 by 90 degrees, the first and second camshafts 410 and 420 are rotated by 90 degrees together and the floating hinge block 210 and the floating latch 220 move together downward. Accordingly, the lid 310 moves downward with the floating hinge block 210 and the floating latch 220, and the pressing portion 311 presses the entire upper surface of the IC 10 evenly. On the other hand, as the floating hinge block 210 and the floating latch 220 move downward, the elastic members 101, 102a, and 102b are in a compressed state. When rotating the handle 440 backward by 90 degrees, the first and second camshafts 410 and 420 are reversely rotated. Then, the lid 310 moves upward with the floating hinge block 210 and the floating latch 220 by the restoring force of the elastic members 101, 102a, and 102b, whereby the pressing portion 311 and the IC 10 are separated from each other.

Figure 9:
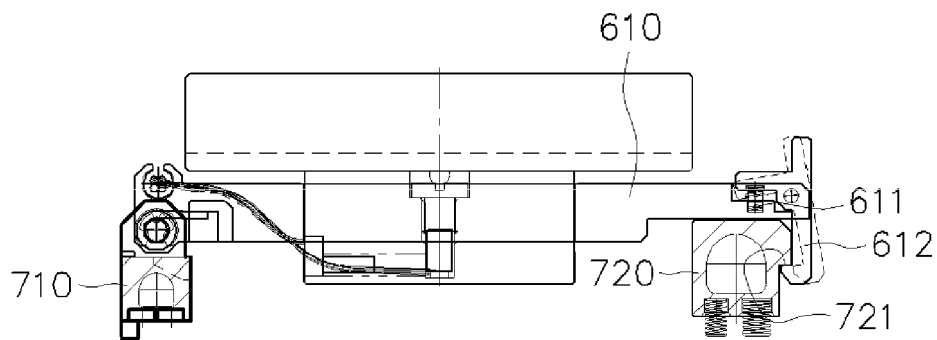
FIG. 9 is a cross-sectional view illustrating a configuration of a socket device for testing an IC according to another embodiment of the present invention.

FIG. 9 is a cross-sectional view illustrating a configuration of a socket device for testing an IC according to another embodiment of the present invention. A repeated description with the former embodiment will be omitted and differences will be mainly described.

As illustrated in FIG. 9, in the socket device of the embodiment, the lid 610, which is rotatably assembled to the floating hinge block 710, has a latch member 612 at the tip end thereof, which is elastically supported by an elastic member 611 and is rotatable. Correspondingly, a floating latch 720 is provided with a latching protrusion 721 to which the latch member 612 is engaged.

The present embodiment is the same as the former embodiment in that the floating hinge block 710 and the floating latch 720 are assembled to the base to be movable vertically, and loading of the IC is performed by operating the handle unit. In this embodiment, the latch member 612 rotatably provided on the lid 610 is engaged with the latching protrusion 721 in a process where the lid 610 and the floating latch 720 are engaged with each other.

Figure 10:
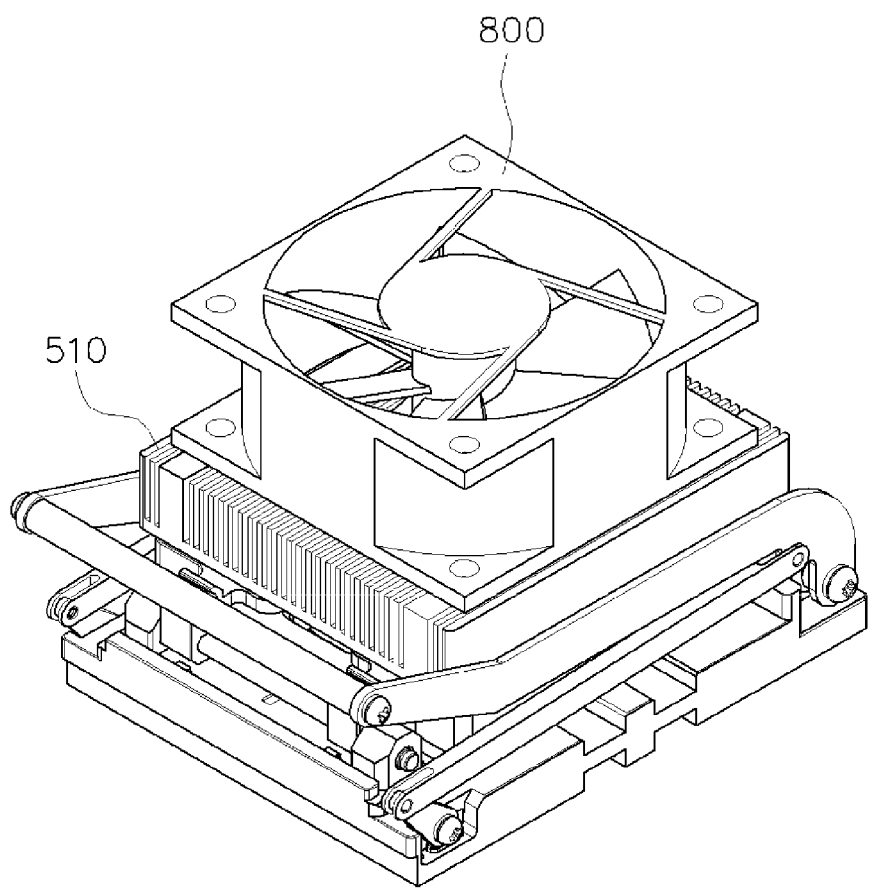
FIG. 10 is a perspective view illustrating a socket device according to still another embodiment of the present invention.

FIG. 10 is a perspective view illustrating a socket device according to still another embodiment of the present invention. A cooling fan 800 may be further provided on the heat sink 510 provided on the lid.

Although the preferred embodiments of the present invention has been described for illustrative purposes with reference to the accompanying drawings, those skilled in the art will appreciate that various modifications, additions and substitutions are possible, without departing from the scope and spirit of the invention as disclosed in the accompanying claims.

What is claimed is:

1. A socket device for testing an integrated circuit (IC), the device comprising:
   a base on which an IC is mounted;
   a contact module provided on the base and having multiple contacts electrically connecting leads of the IC and leads of a printed circuit board (PCB);
   a floating hinge block provided in a manner that being elastically supported on a side of the base in a vertical direction;
   a lid configured to rotate with the floating hinge block and having a pressing portion on a bottom surface thereof, which is configured to protrude to press an upper surface of the IC;
   a floating latch elastically supported on a side of the base to be parallel to the floating hinge block such that the lid is fixed;
   a first camshaft installed by penetrating the base and the floating hinge block and adjusting a height of the floating hinge block according to a rotation angle;
   a second camshaft installed by penetrating the base and the floating latch and adjusting a height of the floating latch according to a rotation angle;
   a lever assembled with the first camshaft as one body and rotating;
   a handle assembled with the second camshaft as one body and rotating;
   a link in which both ends thereof are connected to the lever and the handle respectively to rotate independently.

2. The device of claim 1, wherein each of the first camshaft and the second camshaft includes:
   a first section having a circular cross section and rotatably assembled with the base; and
   a second section extending from the first section, having a cam surface, which forms a plane in an axial direction on a part of an outer circumferential surface, and assembled with the floating hinge block and the floating latch individually.

3. The device of claim 2, wherein each of the floating hinge block and the floating latch has an assembly hole through which the corresponding camshaft is inserted,
   wherein the assembly hole has a plane in which surface contact is made with the corresponding cam surface.

4. The device of claim 1, further comprising: multiple elastic members arranged in parallel between the floating latch and the base,
   wherein the floating latch has a torque, which acts in a direction of engagement with the lid with respect to a rotation axis of the second camshaft.

5. The device of claim 4, wherein the elastic members have different spring constants.

6. The device of claim 1, wherein the pressing portion further includes a heating unit controlling temperature.

7. The device of claim 1, wherein the contact module includes:
   a fixed plate on which the multiple contact pins are disposed such that the fixed plate is fixed to the base; and
   a floating plate which is elastically supported on the fixed plate to be spaced apart each other and through which a top end portion of the contact pins protrudes.

8. The device of claim 7, wherein the floating plate is formed with a guiding surface, which is an inclined side surface thereof to guide a mounting position of the IC.

* * * * *